United States Patent
Peck, Jr.

(10) Patent No.: US 10,033,178 B2
(45) Date of Patent: Jul. 24, 2018

(54) LINEAR ELECTROMAGNETIC DEVICE

(71) Applicant: The Boeing Company, Chicago, IL (US)

(72) Inventor: James L. Peck, Jr., Huntington Beach, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/863,064

(22) Filed: Sep. 23, 2015

(65) Prior Publication Data

US 2016/0012959 A1    Jan. 14, 2016

Related U.S. Application Data

(62) Division of application No. 13/553,267, filed on Jul. 19, 2012, now Pat. No. 9,159,487.

(51) Int. Cl.
*H01F 17/04* (2006.01)
*H01F 7/06* (2006.01)
(Continued)

(52) U.S. Cl.
CPC ............. *H02H 7/263* (2013.01); *G01R 33/02* (2013.01); *H01F 17/06* (2013.01); *H01F 27/2823* (2013.01); *H01F 27/306* (2013.01); *H01F 30/06* (2013.01); *H01F 41/02* (2013.01); *H02J 3/00* (2013.01); *H02J 13/0075* (2013.01); *H01F 27/245* (2013.01); *H01F 2038/006* (2013.01);
(Continued)

(58) Field of Classification Search
CPC .. H01F 27/2823; H01F 27/245; H01F 27/306; H01F 2038/006; H01F 41/02; H01F 30/06; H01F 17/06

USPC ........................... 336/212, 220–222; 29/606
See application file for complete search history.

(56) References Cited

U.S. PATENT DOCUMENTS 352,105 A    11/1886 Zipernowsky et al.
2,215,521 A    9/1940 Finch
(Continued)

FOREIGN PATENT DOCUMENTS

CN    2528090 Y    12/2002
CN    1444237 A    9/2003
(Continued)

OTHER PUBLICATIONS

Chinese Patent Office; Office Action for Chinese Patent Application No. 201310299638.5 dated May 27, 2016, 37 Pages.
(Continued)

*Primary Examiner* — Mangtin Lian
(74) *Attorney, Agent, or Firm* — Charles L. Moore; Moore & Van Allen PLLC

(57) ABSTRACT

A linear electromagnetic device, such as an inductor, transformer or the similar device, may include a core in which a magnetic flux is generable. The device may also include an opening through the core. The device may additionally include a primary conductor received in the opening and extending through the core. The primary conductor may include a substantially square or rectangular cross-section. An electrical current flowing through the primary conductor generates a magnetic field about the primary conductor, wherein substantially the entire magnetic field is absorbed by the core to generate the magnetic flux in the core.

21 Claims, 10 Drawing Sheets

(51) Int. Cl.

| | |
|---|---|
| *H01F 27/24* | (2006.01) |
| *H02H 7/26* | (2006.01) |
| *H01F 27/30* | (2006.01) |
| *H01F 30/06* | (2006.01) |
| *H01F 17/06* | (2006.01) |
| *H01F 27/28* | (2006.01) |
| *H01F 41/02* | (2006.01) |
| *G01R 33/02* | (2006.01) |
| *H02J 3/00* | (2006.01) |
| *H01F 38/00* | (2006.01) |
| *H01F 27/245* | (2006.01) |
| *H02J 13/00* | (2006.01) |

(52) U.S. Cl.
CPC ..... *H02J 13/0062* (2013.01); *H02J 2003/001* (2013.01); *Y02E 60/725* (2013.01); *Y02E 60/74* (2013.01); *Y02E 60/7838* (2013.01); *Y02E 60/7853* (2013.01); *Y04S 10/20* (2013.01); *Y04S 10/30* (2013.01); *Y04S 10/525* (2013.01); *Y04S 40/124* (2013.01); *Y04S 40/126* (2013.01)

(56) References Cited

U.S. PATENT DOCUMENTS

| | | |
|---|---|---|
| 2,411,374 A | 11/1946 | Horstman |
| 2,569,675 A | 10/1951 | Keefe |
| 2,780,771 A | 2/1957 | Bernard |
| 3,042,849 A | 7/1962 | Dortort |
| 3,411,121 A | 11/1968 | Twomey |
| 3,451,130 A | 6/1969 | Ellis |
| 3,464,002 A | 8/1969 | Hentschel |
| 3,602,859 A | 8/1971 | Dao |
| 4,020,440 A | 4/1977 | Moerman |
| 4,081,777 A | 3/1978 | Cronk |
| 4,338,657 A | 7/1982 | Lisin et al. |
| 4,520,335 A | 5/1985 | Rauch et al. |
| 4,520,556 A | 6/1985 | Pasko et al. |
| 4,565,746 A | 1/1986 | Hayase |
| 4,577,175 A | 3/1986 | Burgher et al. |
| 4,616,205 A | 10/1986 | Praught et al. |
| 4,668,931 A | 5/1987 | Boenitz |
| 4,684,882 A | 8/1987 | Blain |
| 4,897,626 A | 1/1990 | Fitter et al. |
| 4,972,353 A | 11/1990 | Kennedy et al. |
| 5,351,017 A | 9/1994 | Yano et al. |
| 5,486,756 A | 1/1996 | Kawakami et al. |
| 5,534,831 A | 7/1996 | Yabuki et al. |
| 5,534,837 A | 7/1996 | Brandt |
| 5,557,249 A | 9/1996 | Reynal |
| 5,668,707 A | 9/1997 | Barrett |
| 5,737,203 A | 4/1998 | Barrett et al. |
| 5,999,078 A | 12/1999 | Herbert et al. |
| 6,144,282 A | 11/2000 | Lee |
| 6,181,079 B1 | 1/2001 | Chang et al. |
| 6,715,198 B2* | 4/2004 | Kawakami ............ G01R 33/02 29/595 |
| 6,972,657 B1 | 12/2005 | Pacala et al. |
| 6,995,646 B1 | 2/2006 | Fromm et al. |
| 7,015,691 B2 | 3/2006 | Kang et al. |
| 7,023,313 B2 | 4/2006 | Sutardja |
| 7,023,317 B1 | 4/2006 | Herbert |
| 7,071,807 B1 | 7/2006 | Herbert |
| 7,106,047 B2 | 9/2006 | Taniguchi |
| 7,148,675 B2 | 12/2006 | Itoh |
| 7,280,025 B2 | 10/2007 | Sano |
| 7,307,502 B2 | 12/2007 | Sutardja |
| 7,342,477 B2 | 3/2008 | Brandt et al. |
| 7,362,206 B1 | 4/2008 | Herbert |
| 7,378,828 B2 | 5/2008 | Brandt |
| 7,407,596 B2 | 8/2008 | Choi et al. |
| 7,639,520 B1 | 12/2009 | Zansky et al. |
| 8,497,677 B2 | 7/2013 | Miyahara |
| 8,582,255 B2 | 11/2013 | Xin et al. |
| 8,980,053 B2 | 3/2015 | Krahn et al. |
| 9,106,125 B1 | 8/2015 | Brandt et al. |
| 9,159,487 B2 | 10/2015 | Peck |
| 2001/0052837 A1* | 12/2001 | Walsh ................ H01F 17/0006 336/174 |
| 2002/0075119 A1 | 6/2002 | Herbert |
| 2002/0163330 A1 | 11/2002 | Sekiya |
| 2003/0080845 A1 | 5/2003 | Fontanella et al. |
| 2003/0117251 A1 | 6/2003 | Haugs et al. |
| 2004/0027121 A1 | 2/2004 | Choi et al. |
| 2004/0051617 A1 | 3/2004 | Buswell |
| 2004/0124958 A1 | 7/2004 | Watts et al. |
| 2004/0135661 A1 | 7/2004 | Haugs et al. |
| 2005/0035761 A1 | 2/2005 | Park et al. |
| 2005/0093669 A1 | 5/2005 | Ahn et al. |
| 2006/0082430 A1 | 4/2006 | Sutardja |
| 2006/0089022 A1 | 4/2006 | Sano |
| 2006/0197480 A1 | 9/2006 | Mori et al. |
| 2007/0171019 A1 | 7/2007 | Sutardja |
| 2008/0150664 A1 | 6/2008 | Blankenship et al. |
| 2008/0163475 A1 | 7/2008 | Snyder |
| 2009/0128274 A1 | 5/2009 | Park et al. |
| 2009/0244937 A1 | 10/2009 | Liu |
| 2009/0289754 A1* | 11/2009 | Shpiro ................ H01F 17/062 336/84 C |
| 2010/0134044 A1* | 6/2010 | Sin ............................ H01F 3/14 315/294 |
| 2010/0134058 A1 | 6/2010 | Nagashima et al. |
| 2010/0164673 A1 | 7/2010 | Shim |
| 2010/0194373 A1 | 8/2010 | Hamberger et al. |
| 2011/0095858 A1 | 4/2011 | Spurny |
| 2011/0163834 A1 | 7/2011 | Stahmann et al. |
| 2011/0210722 A1 | 9/2011 | Paci et al. |
| 2011/0279100 A1 | 11/2011 | Ikriannikov |
| 2011/0279212 A1 | 11/2011 | Ikriannikov et al. |
| 2012/0150679 A1 | 6/2012 | Lazaris |
| 2012/0225784 A1 | 9/2012 | Piascik et al. |
| 2012/0226386 A1 | 9/2012 | Kulathu et al. |
| 2012/0315792 A1 | 12/2012 | Costello |
| 2013/0043725 A1 | 2/2013 | Birkelund |
| 2013/0049751 A1 | 2/2013 | Hamberger et al. |
| 2013/0082814 A1* | 4/2013 | Markowski ............ H01F 30/06 336/215 |
| 2013/0255899 A1 | 10/2013 | Krahn et al. |
| 2013/0328165 A1* | 12/2013 | Harburg ................ H01L 28/10 257/531 |
| 2014/0022040 A1 | 1/2014 | Peck |
| 2014/0210585 A1 | 7/2014 | Peck, Jr. |
| 2014/0232384 A1 | 8/2014 | Peck, Jr. |
| 2014/0347153 A1 | 11/2014 | Moon |
| 2015/0043119 A1 | 2/2015 | Peck, Jr. |
| 2016/0189847 A1 | 6/2016 | Willis |
| 2017/0047155 A1 | 2/2017 | Yao et al. |
| 2017/0053728 A1 | 2/2017 | Mehrotra et al. |

FOREIGN PATENT DOCUMENTS

| | | |
|---|---|---|
| CN | 1495435 A | 5/2004 |
| CN | 1514258 A | 7/2004 |
| CN | 1577647 A | 2/2005 |
| CN | 1615462 A | 5/2005 |
| CN | 1637969 A | 7/2005 |
| CN | 1763872 A | 4/2006 |
| CN | 101995507 A | 3/2011 |
| CN | 202839278 U | 3/2013 |
| DE | 2926423 A1 | 1/1981 |
| DE | 4129265 A1 | 3/1993 |
| EP | 1345036 A2 | 9/2003 |
| EP | 2688076 A2 | 1/2014 |
| JP | 59119810 A | 7/1984 |
| JP | 01242333 A | 9/1989 |
| JP | 02096797 A | 4/1990 |
| JP | 02192705 A | 7/1990 |
| JP | 06260869 A | 9/1994 |
| JP | 09-077452 A | 3/1997 |
| JP | 2001167933 A | 6/2001 |
| JP | 2005116666 A | 4/2005 |

(56) References Cited

FOREIGN PATENT DOCUMENTS

| JP | 2010127889 A | 6/2010 |
|---|---|---|
| JP | 2011238653 A | 11/2011 |
| RU | 2007146701 A | 6/2009 |
| WO | 02095775 A1 | 11/2002 |
| WO | 2007078403 A2 | 7/2007 |
| WO | 2009075110 A1 | 6/2009 |
| WO | 2014130122 A1 | 8/2014 |

OTHER PUBLICATIONS

Chinese Patent Office; Office Action for Chinese Patent Application No. 2013800736555 dated Aug. 26, 2016, 16 Pages.
European Patent Office; International Search Report and Written Opinion for International Application No. PCT/US2013/072789 dated May 27, 2014, 12 Pages.
International Bureau of WIPO; International Preliminary Report on Patentability for International Application No. PCT/US2013/072789 dated Aug. 25, 2015, 9 Pages.
Wilson, Earl J.; "Strain-Gage Instrumentation," Harris' Shock and Vibration Handbook, 2002, pp. 17.1-17.15, Chapter 17, 5th Edition.
Chee, Clinton Y.K., et al.; "A Review on the Modelling of Piezoelectric Sensors and Actuators Incorporated in Intelligent Structures," Journal of Intelligent Material Systems and Structures, 1998, pp. 3-19, vol. 9.
Simoes Moita, Jose M., et al.; "Active control of adaptive laminated structures with bonded piezoelectric sensors and actuators," Computers and Structures, 2004, pp. 1349-1358, vol. 82.
Fedder, Gary K., et al.; "Laminated High-Aspect-Ratio Microstructures in a Conventional CMOS Process," Proceedings of the IEEE Micro Electro Mechanical Systems Workshop, 1996, pp. 13-18.
European Patent Office; Extended European Search Report for European Patent Application No. 14178702.8 dated Jan. 21, 2015, 7 Pages.
European Patent Office; Extended European Search Report for European Patent Application No. 14179801.7 dated Jul. 10, 2015, 14 Pages.
European Patent Office; Extended European Search Report for European Patent Application No. 13173067.3 dated Nov. 3, 2015, 9 Pages.
Japanese Patent Office; Office Action for Japanese Patent Application No. 2013-149909 dated Jun. 6, 2017, 6 Pages.
European Patent Office; Extended European Search Report for European Patent Application No. 16195663.6 dated May 26, 2017, 9 Pages.
European Patent Office; Extended European Search Report for European Patent Application No. 16205134.6 dated May 29, 2017, 9 Pages.
Chinese Patent Office; Office Action for Chinese Patent Application No. 201310299638.5 dated Dec. 18, 2017, 37 Pages.
Russian Patent Office; Office Action for Russian Patent Application No. 2013130327/07(045241) dated Jul. 18, 2017, 8 Pages.
Chinese Patent Office; Office Action for Chinese Patent Application No. 201310299638.5 dated Jul. 14, 2017, 33 Pages.

\* cited by examiner

LINEAR ELECTROMAGNETIC DEVICE

FIELD

The present disclosure relates to electromagnetic devices, such as electrical transformers and inductors, and more particularly to a linear electromagnetic device, such as a liner transformer, linear inductor or similar device.

BACKGROUND

FIG. 1 is an example of an electromagnetic device 100 which may be an inductor or transformer. The electromagnetic device 100 includes a plurality of electrical conductors, wires or windings 102 wrapped or wound around a ferromagnetic core 104. The core 104 is an electromagnetic material and is magnetized in response to an electrical current flowing in the windings 102. A magnetic flux illustrated by broken lines 106 and 108 is also generated by the electromagnetic device 100 in response to the electrical current flowing through the windings 102. As illustrated in FIG. 1, the magnetic flux 106 and 108 will flow in a path through the core 102 and in the free space about the electromagnetic device 100. Accordingly, the magnetic flux 106 and 108 flowing in free space about the electromagnetic device 100 does not produce any useful energy coupling or transfer and is inefficient. Because of this inefficiency, such prior art electromagnetic devices, inductors, transformers and the like, generally require larger, heavier electromagnetic cores and additional windings to provide a desired energy conversion or transfer.

SUMMARY

In accordance with an embodiment, a linear electromagnetic device, such as a linear inductor, transformer or the similar device, may include a core in which a magnetic flux is generable. The device may also include an opening through the core. The device may additionally include a primary conductor received in the opening and extending through the core. The primary conductor may include a substantially square or rectangular cross-section. An electrical current flowing through the primary conductor generates a magnetic field about the primary conductor, wherein substantially the entire magnetic field is absorbed by the core to generate the magnetic flux in the core.

In accordance with another embodiment, a linear electromagnetic device may include a core in which a magnetic flux is generable. The electromagnetic device may also include an opening through the core and a primary conductor received in the opening and extending through the core. The primary conductor may include a substantially square or rectangular cross-section. An electrical current flowing through the primary conductor generates a magnetic field about the primary conductor, wherein substantially the entire magnetic field is absorbed by the core to generate the magnetic flux in the core. The electromagnetic device may also include a secondary conductor received in the opening and extending through the core. The secondary conductor may include a substantially square or rectangular cross-section to receive an electromotive force transmitted by the core.

In accordance with another embodiment, a method of increasing a magnetic flux from an electromagnetic device may include providing a core in which a magnetic flux is generable. The method may also include extending a primary conductor through an opening in the core. The primary conductor may include a substantially square or rectangular cross-section. The method may further include passing an electrical current through the primary conductor to generate a magnetic field about the primary conductor, wherein substantially the entire magnetic field is absorbed by the core to generate a magnetic flux in the core.

Other aspects and features of the present disclosure, as defined solely by the claims, will become apparent to those ordinarily skilled in the art upon review of the following non-limited detailed description of the disclosure in conjunction with the accompanying figures.

BRIEF DESCRIPTION OF THE SEVERAL VIEWS OF THE DRAWINGS

The following detailed description of embodiments refers to the accompanying drawings, which illustrate specific embodiments of the disclosure. Other embodiments having different structures and operations do not depart from the scope of the present disclosure.

DESCRIPTION

Figure 1:
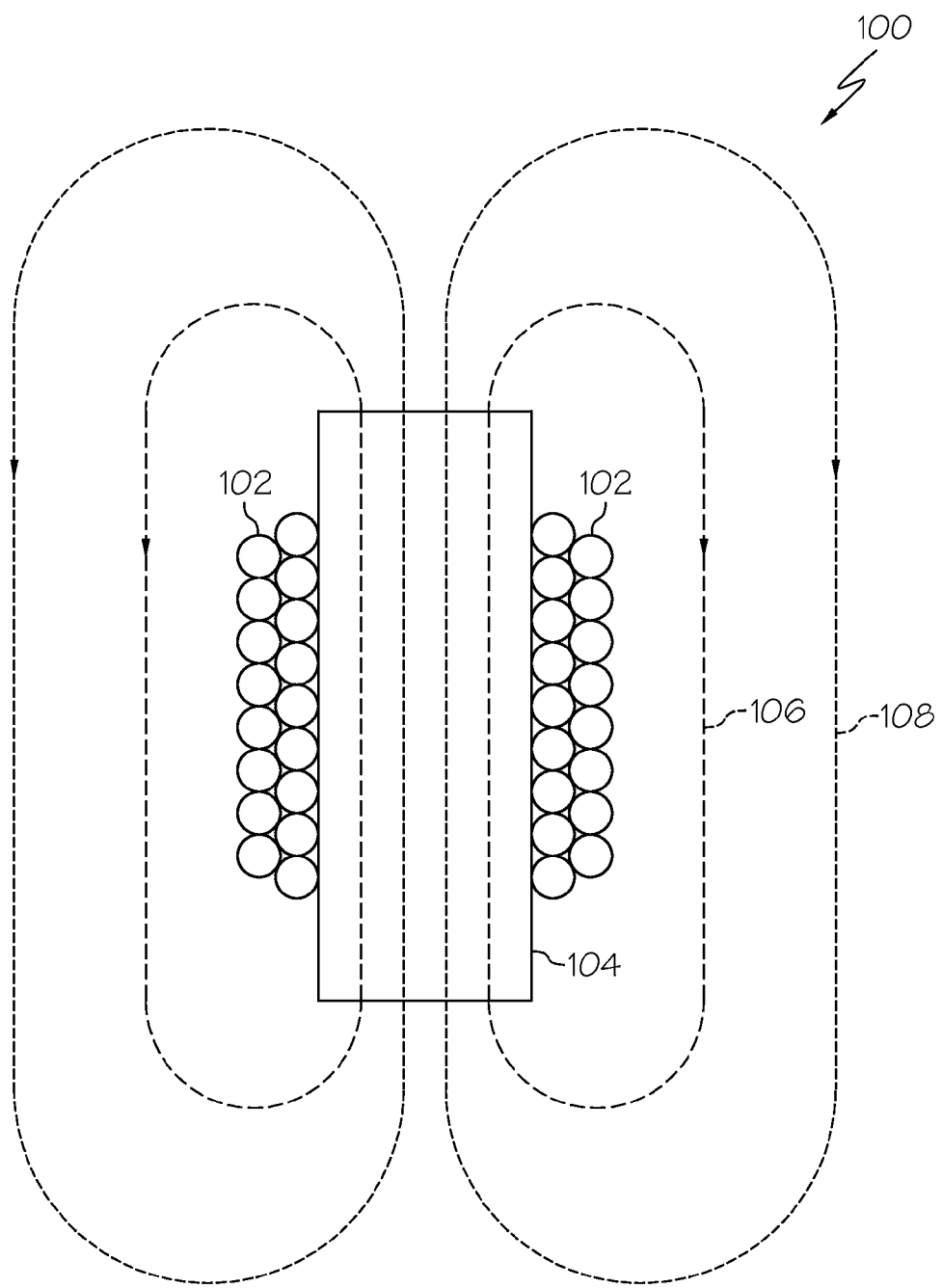
FIG. 1 is an example of a prior art transformer.

The following detailed description of embodiments refers to the accompanying drawings, which illustrate specific embodiments of the disclosure. Other embodiments having different structures and operations do not depart from the scope of the present disclosure. Like reference numerals may refer to the same element or component in the different drawings.

Figure 2A:
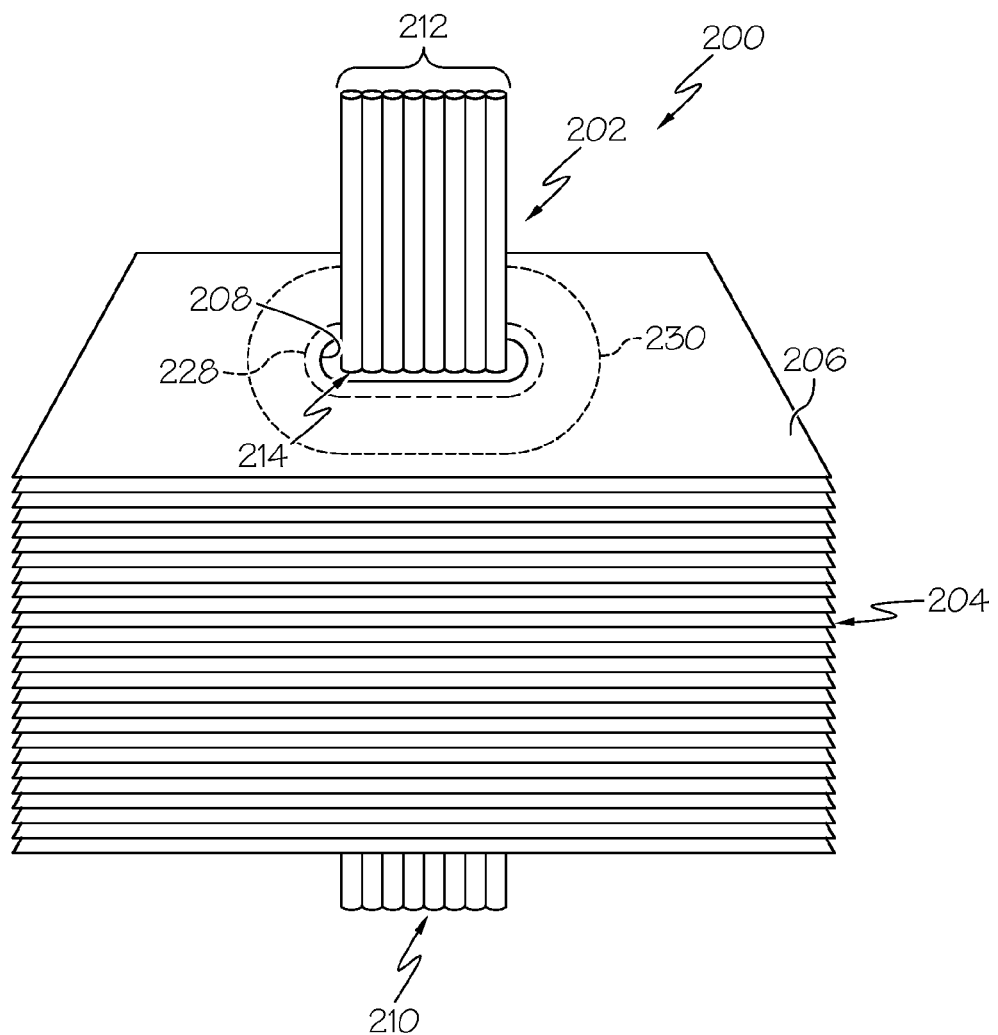
FIG. 2A is a perspective view of an example of an electromagnetic device in accordance with an embodiment of the present disclosure.

In accordance with an embodiment of the present disclosure, a linear transformer is a magnetic device where a linear primary electrical conductor or conductors and one or more linear secondary electrical conductors or wires pass through a magnetic core. The core may be one piece and no turns of the primary and secondary electrical conductors about the core are required. While the core may be one piece, the one piece core may be formed from a plurality of stacked plates or laminates. An alternating current may be conducted through the primary. A magnetic flux from the current in the primary is absorbed by the core. When the current in the primary decreases the core transmits an electromotive force (desorbs) into the secondary wires. A feature of the linear transformer is the linear pass of the primary and secondary conductors through the core. One core may be used as a stand alone device or a series of two or more cores may be used where a longer linear exposure is required. Another feature of this transformer is that the entire magnetic field or at least a substantial portion of the magnetic field generated by the current in the primary is absorbed by the core, and desorbed into the secondary. The core of the transformer may be sized or include dimensions so that substantially the entire magnetic field generated by the current is absorbed by the core and so that the magnetic flux is substantially completely contained with the core. This forms a highly efficient transformer with very low copper losses, high efficiency energy transfer, low thermal emission and very low radiated emissions. Additionally the linear transformer is a minimum of 50% lower in volume and weight then existing configurations FIG. 2A is a perspective view of an example of an electromagnetic device 200 in accordance with an embodiment of the present disclosure. The electromagnetic device 200 illustrated in FIG. 2A is configured as a linear inductor 202. The linear inductor 202 may include a core 204. The core 204 may include a plurality of plates 206 or laminations stacked on one another. The plates 206 may be made from a silicon steel alloy, a nickel-iron alloy or other metallic material capable of generating a magnetic flux similar to that described herein. For example, the core 204 may be a nickel-iron alloy including about 20% by weight iron and about 80% by weight nickel. The plates 206 may be substantially square or rectangular, or may have some other geometric shape depending on the application of the electromagnetic device and the environment where the electromagnetic device 200 may be located. For example, the substantially square or rectangular plates 206 may be defined as any type of polygon to fit a certain application.

An opening is formed through each of the plates 206 and the openings are aligned to form an opening 208 or passage through the core 204 when the plates 206 are stacked on one another with the plate openings in alignment with one another. The opening 208 or passage may be formed in substantially a center or central portion of the core 204 and extend substantially perpendicular to a plane defined by each plate 206 of the stack of plates 206 or laminates. In another embodiment, the opening 208 may be formed off center from a central portion of the core 204 in the planes defined by each of the plates 206 for purposes of providing a particular magnetic flux or to satisfy certain constraints.

An electrical conductor 210 or wire may be received in the opening 208 and may extend through the core 204 perpendicular the plane of each of the plates 206. The electrical conductor 210 may be a primary conductor. In the exemplary embodiment illustrated in FIG. 2A, the electrical conductor 210 is a plurality of electrical conductors 212 or wires. In another embodiment, the electrical conductor 210 may be a single conductor.

Figure 2B:
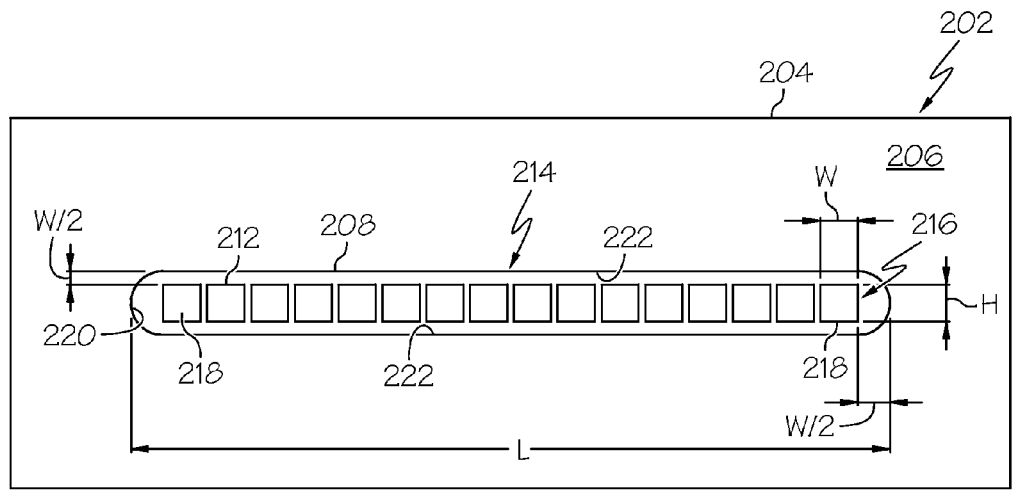
FIG. 2B is a top view of the electromagnetic device of FIG. 2A.

Referring also to FIG. 2B, FIG. 2B is a top view of the linear inductor 202 of FIG. 1A. The opening 208 through the core 204 may be an elongated slot 214. As previously discussed, the opening 208 or elongated slot may be formed through a center or central portion of the core 204 when looking into the plane of the top plate 206. The opening 208 or elongated slot 214 may be an equal distance from opposite sides of the core 204, or as illustrated in FIG. 2B, the elongated slot 214 may be off set and may be closer to one side of the core 204. For some applications, the opening 208 may also be formed in a shape other than an elongated slot 214 depending upon the application and desired path of the magnetic flux generated in the core.

As previously discussed, the electrical conductor 210 may be a plurality of primary conductors 212 that are aligned adjacent one another or disposed in a single row 216 within the elongated slot 214. Each of the conductors 212 may include a substantially square or rectangular cross-section as illustrated in FIG. 2B. The substantially square or rectangular cross-section may be defined as being exactly square or rectangular or may have rounded edges or other features depending upon the application and desired coupling or transfer of magnetic flux into the core 204 when an electrical current flows through the conductors 212. The conduction 210 may also be a single elongated ribbon conductor extending within the elongated slot 214 and having a cross-section corresponding to the elongated slot or other opening shape.

The cross-section of each primary conductor 212 may have a predetermined width "W" in a direction corresponding to an elongated dimension or length "L" of the elongated slot 214. An end primary conductor 218 at each end of the single row 216 of conductors is less than about one half of the predetermined width "W" from an end 220 of the elongated slot 214. Each conductor 212 also has a predetermined height "H." Each conductor 212 is less than about one half of the predetermined height "H" from a side wall 222 of the elongated slot 214.

Figure 2C:
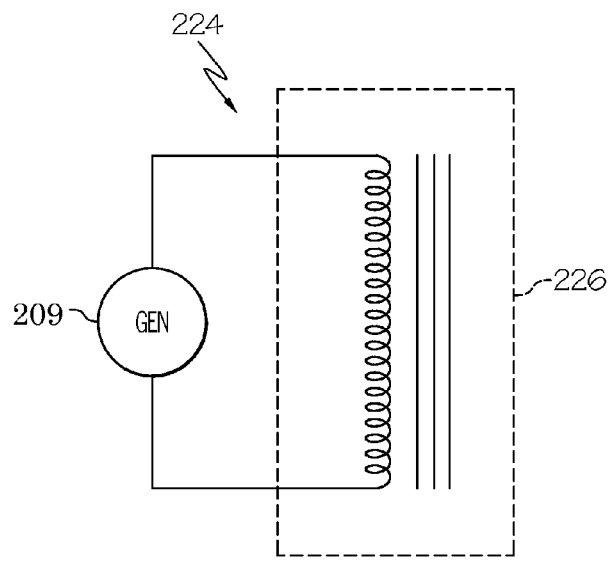
FIG. 2C is a block diagram an example of an electrical circuit including the linear inductor of FIG. 1A in accordance with an embodiment of the present disclosure.

FIG. 2C is a block diagram an example of an electrical circuit 224 including a linear inductor 226 in accordance with an embodiment of the present disclosure. The linear inductor 226 may be the same as the linear inductor 202 in FIGS. 2A and 2B. A generator 209 may be connected to the linear inductor 226 to conduct an electrical current through the linear inductor 226. A magnetic field is generated about the electrical conductor 210 (FIGS. 2A and 2B) or each of the plurality of electrical conductors 212 in response to the electrical current flowing in the conductor or conductors. The core 204 may be sized so that substantially the entire magnetic field is absorbed by the core 204 to generate a magnetic flux in the core 204 as illustrated by broken lines 228 and 230 in FIG. 2A and the core may be sized so that the magnetic flux is substantially completely contained within the core. In an embodiment, the core 204 may be sized relative to the conductor or conductors and electrical current flowing in the conductor or conductors to absorb at least about 96% of the magnetic field to generate the magnetic flux in the core 204. The magnetic flux may also be at least about 96% contained within the core 24. Any magnetic flux generated outside the core 204 may be infinitesimally small compared to the magnetic flux contained within the core.

Figure 3A:
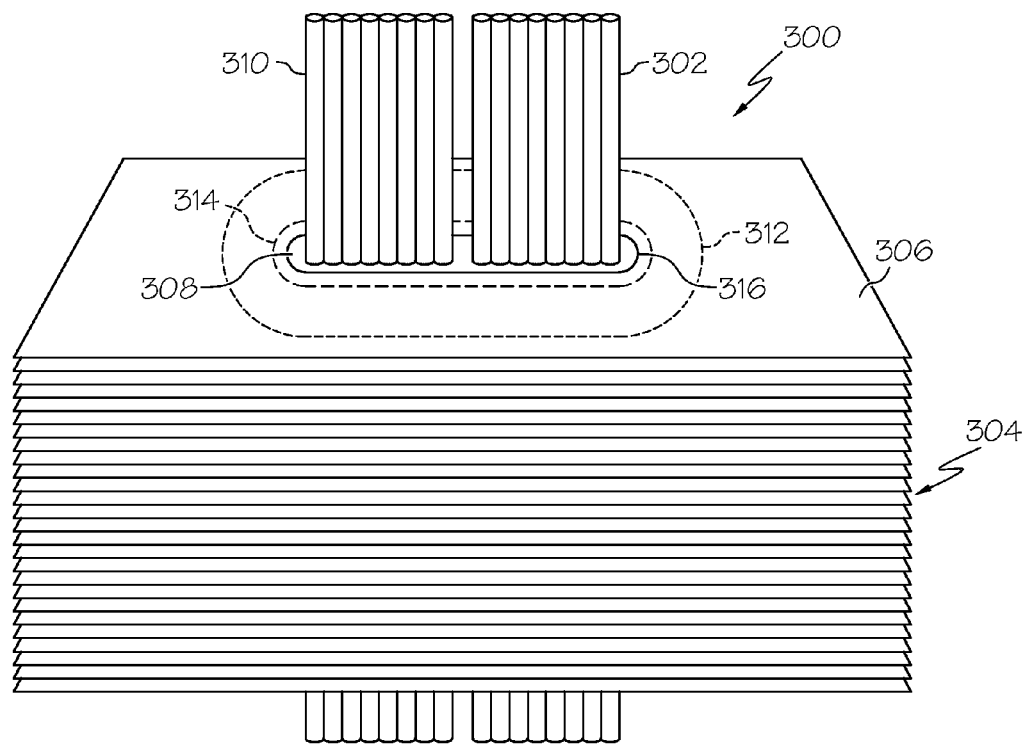
FIG. 3A is a perspective view of an example of an electromagnetic device configured as a linear transformer in accordance with an embodiment of the present disclosure.

FIG. 3A is a perspective view of an example of an electromagnetic device in the configuration of a linear transformer 300 in accordance with an embodiment of the present disclosure. The linear transformer 300 is similar to the linear inductor 202 of FIG. 2A but includes a secondary conductor 302 or plurality of secondary conductors. Accordingly, the linear transformer 300 includes a core 304 in which a magnetic flux may be generated. Similar to that previously described, the core 304 may include a plurality of plates or laminations 306 that may be stacked upon one another as illustrated and FIG. 3 A. Each of the plates 306 they have an opening formed therein to provide an opening 308 or passage through the core 304. The opening 308 or passage through the core 304 may be substantially perpendicular to a plane defined by each of the plates 306. The secondary conductor or conductors 302 extend within the opening 308 through the core 304. The primary conductor or plurality of primary conductors 310 may extend adjacent to the secondary conductors 302 within the opening 308 through the core 304.

Similar to that previously described, each of the primary conductors 310 may have a substantially square or rectangular cross-section. An electrical current flowing through the primary conductor or conductors generates a magnetic field about the primary conductor. The core 304 may be sized or to include length and width dimensions of the plates 306 to absorb substantially the entire magnetic field to generate the magnetic flux as illustrated by broken lines 312 and 314 in FIG. 3A. The core 304 may also be sized or include length and width dimensions so that the magnetic flux is substantially entirely contained within the core 304. In an embodiment, the core 304 may be sized or may include width and length dimensions of the plates 306 to absorb at least about 96% of the magnetic field and/or to contain at least about 96% of the magnetic flux.

Each of the secondary conductors 302 extending through the core 304 may also have a substantially square or rectangular cross-section to receive an electro-motive force transmitted by the core 304.

The opening 308 through the core 304 may be an elongated slot 316 similar to the elongated slot 214 in FIGS. 2A and 2B. The plurality of primary conductors 310 and plurality of secondary conductors 302 may each be disposed adjacent one another in a single row in the elongated slot 316.

A cross-section of each primary conductor 310 of the plurality of conductors and each secondary conductor 302 of the plurality of conductors may have a predetermined width "W" in a direction corresponding to a length of the elongated slot 316 similar to that illustrated in FIG. 2B. An end primary conductor adjacent one end of the elongated slot 316 is less than about one half of the predetermined width "W" from the one end of the elongated slot 316. An end secondary conductor adjacent an opposite end of the elongated slot 316 is less than about one half of the predetermined width "W" from the opposite end of the elongated slot.

The cross-section of each primary conductor 310 and secondary conductor 302 may have a predetermined height "H." Each primary conductor 310 and second conductor 302 is less than about one half of the predetermined height "H" from a side wall of the elongated slot 316.

Figure 3B:
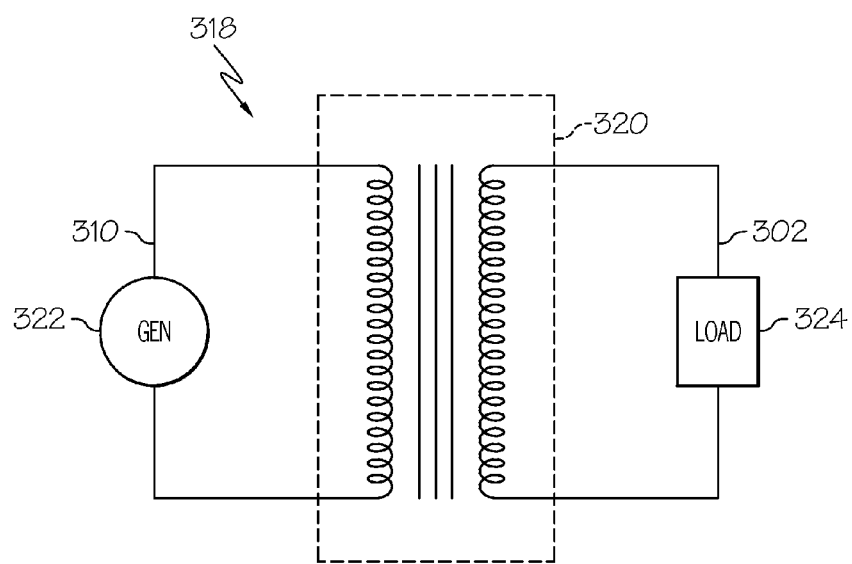
FIG. 3B is a block diagram an example of an electrical circuit including the linear transformer of FIG. 3A in accordance with an embodiment of the present disclosure.

FIG. 3B is a block diagram an example of an electrical circuit 318 including a linear transformer 320 in accordance with an embodiment of the present disclosure. The linear transformer 320 may be the same as the linear transformer 300 in FIG. 3A. A generator 322 may be connected to the primary conductors 310 and a load 324 may be connected to the secondary conductors 302. Voltage and current supplied by the generator 322 to the linear transformer 320 is converted or transformed based on the number and characteristics of primary conductors or windings and the number and characteristics of secondary conductors or windings and the core 304.

Figure 4:
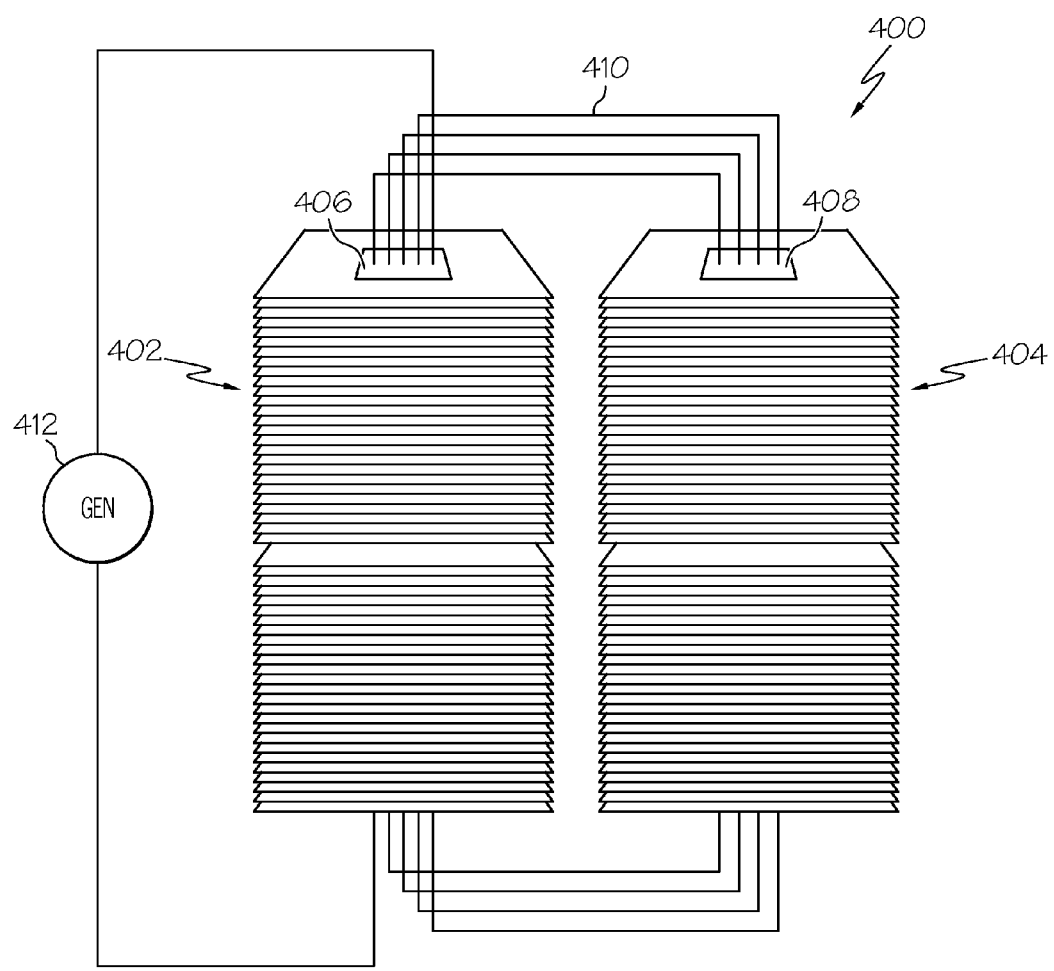
FIG. 4 is a perspective view of an example of a linear inductor in accordance with another embodiment of the present disclosure.

FIG. 4 is a perspective view of an example of a linear inductor 400 in accordance with another embodiment of the present disclosure. The linear inductor 400 may be similar to the linear inductor 202 in FIG. 2A except the linear inductor 400 may include two or more cores 402 and 404. Each core 402 and 404 has a respective opening 406 and 408 formed there-through. An electrical conductor 410 extends through each of the openings 406 and 408. Each of the openings 406 and 408 may be an elongated slot similar to that previously described. The electrical conductor 410 may be a plurality of conductors disposed adjacent one another in a single row in the elongated slot that forms each opening 406 and 408. Each of the plurality of conductors may have a substantially square or rectangular cross-section.

The lamination slot or opening through the laminated core is typically one slot to a lamination core to maintain separation between magnetic flux storage and magnetic flux flows. However, two or more slots or openings can be in the same lamination or core if the spacing is such that each flux storage and flux flow area does not interfere with an adjacent slot. The total current in each slot or opening defines the area or volume of the lamination or core for storage. Separate laminations or cores for each slot insures no interference.

A generator 412 or electrical power source may be connected to the linear inductor 400. The generator 412 may supply an electrical current to the conductor 410 or conductors to generate a magnetic field about the conductor 410. The magnetic field will be substantially entirely absorbed by the cores 402 and 404 to generate a magnetic flux in each core 402 and 404.

Figure 5:
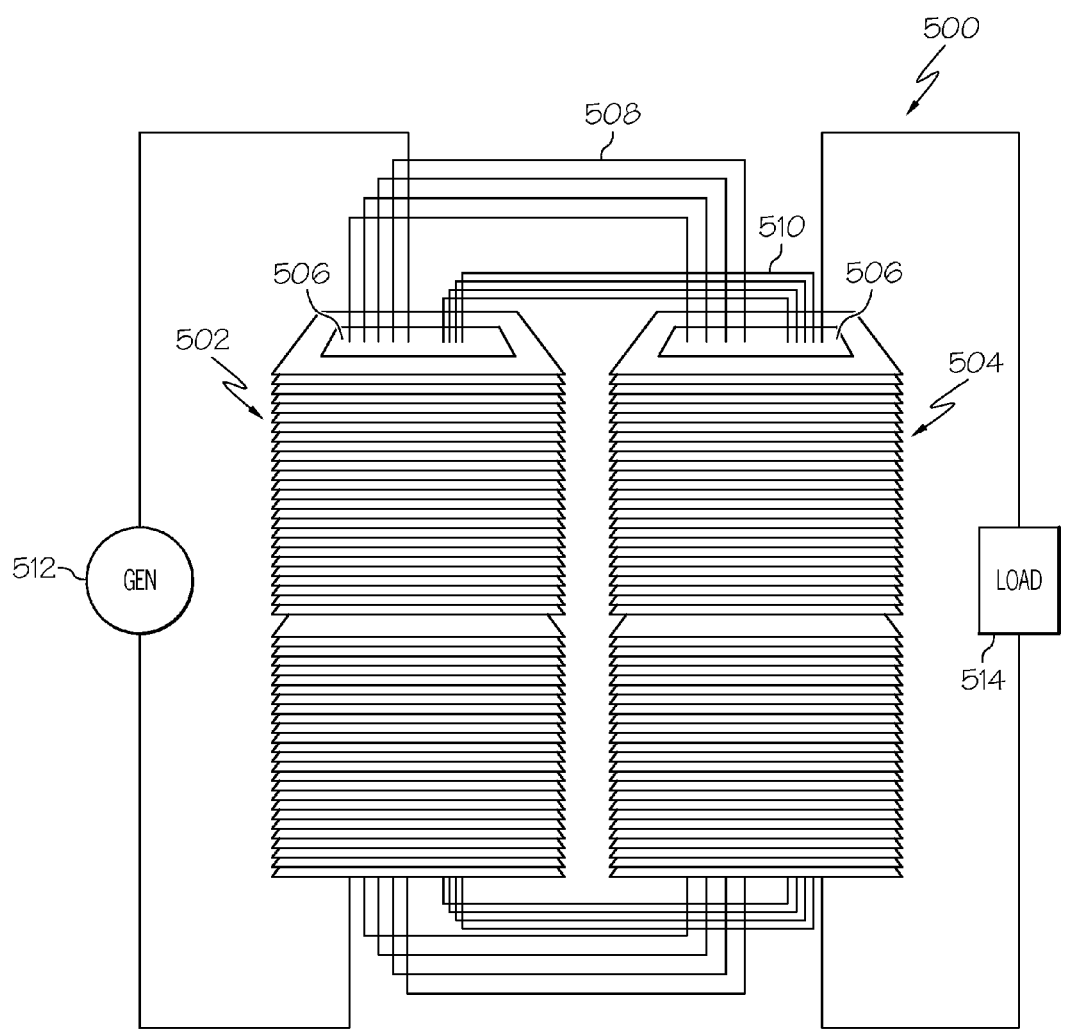
FIG. 5 is a perspective view of an example of a linear transformer in accordance with another embodiment of the present disclosure.

FIG. 5 is a perspective view of an example of a linear transformer 500 in accordance with another embodiment of the present disclosure. The linear transformer 500 may be same as the linear transformer 300 in FIG. 3A except the transformer 500 may include two or more cores 502 and 504. Similar to the transformer 300, each core 502 and 504 may have an opening 506 formed through a center or substantially central portion of the core. Each opening 506 may be a substantially elongated slot.

A primary conductor 508 and a secondary conductor 510 may extend through the opening 506 in each core 502 and 504. The primary conductor 508 may be a single conductor or a plurality of electrical conductors or wires as illustrated in FIG. 5 and the secondary conductor 510 may a single conductor or may also include a plurality of electrical conductors or wires as illustrated in FIG. 5. Each primary conductor 508 and secondary conductor 510 may have a substantially square or rectangular cross-section similar to conductors 212 illustrated in FIG. 2B. The primary conductors 508 may be disposed adjacent one another in a single row within the elongated slot similar to that illustrated in FIG. 2B. The secondary conductors 510 may also be disposed adjacent one another in a single row within the elongated slot. The plurality of secondary conductors 510 may be disposed adjacent the primary conductors 508 in the same row at a predetermined spacing between the pluralities of conductors. The primary and secondary conductors 508 and 510 may be disposed in the elongated slot at a spacing from the sides of the slot to provide substantially complete magnetic coupling between the conductors 508 and 510 and the cores 502 and 504. Accordingly, when an electric current is passed through the primary conductor 508 or conductors, substantially the entire magnetic field around the primary conductor is coupled into the cores 502 and 504 to generate the magnetic flux in the cores 502 and 504. The cores 502 and 504 may also be sized or include dimensions so that at least about 96% of the magnetic flux is coupled into or absorbed by the cores 502 and 504. Similarly, the magnetic flux will be substantially completely or at least about 96% coupled to the secondary conductor 510 or conductors to generate an electrical current in the secondary conductor 510 or conductors.

A generator 512 or electrical source may be connected to the primary conductor 508 or conductors to apply an electrical current to the primary conductor. A load 514 may be connected to the secondary conductor 510 or conductors to receive the transformed electrical power from the linear transformer 500.

Figure 6:
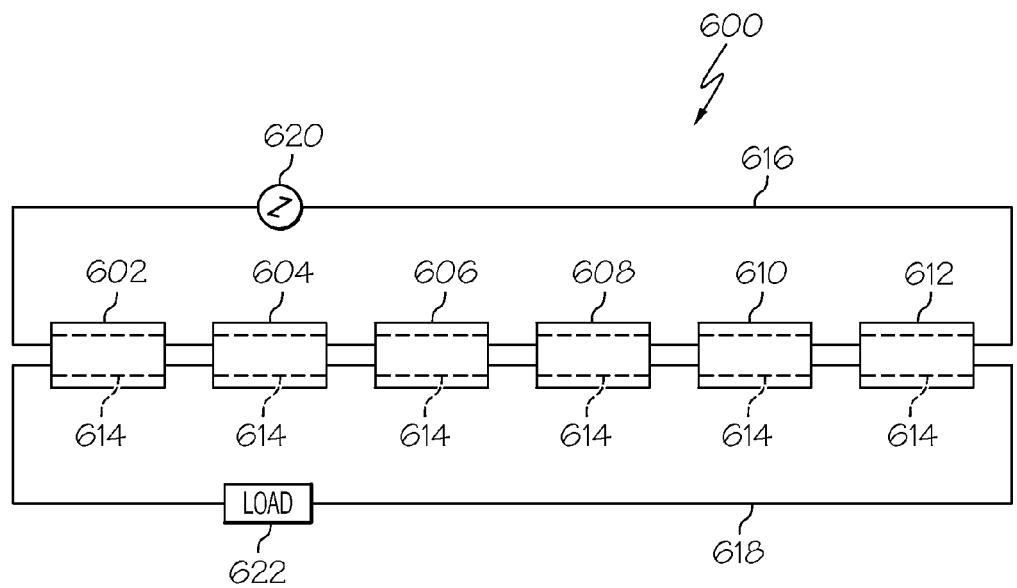
FIG. 6 is an illustration of an example of a linear transformer in accordance with another embodiment of the present disclosure.

FIG. 6 is an illustration of an example of a linear transformer 600 in accordance with another embodiment of the present disclosure. The linear transformer 600 may be similar to the linear transformer 300 in FIG. 3A except the transformer 600 includes a plurality of cores 602-612. Each of the cores 602-612 may have an opening 614 formed through the core. The opening 614 may be through substantially a center or central portion of the core 602-612. Each opening 614 may be an elongated slot or other configuration. A primary conductor 616 or conductors and a secondary conductor 618 or conductors may pass through the opening 614 in each core 602-612. Each of the primary conductors 616 and secondary conductors 618 may have a substantially square or rectangular cross-section and may be disposed in the elongated slot adjacent one another in a single row. An electrical source 620 may be connected to the primary conductor 616 or conductors and a load 622 may be connected to the secondary conductor 618 or conductors.

Figure 7A:
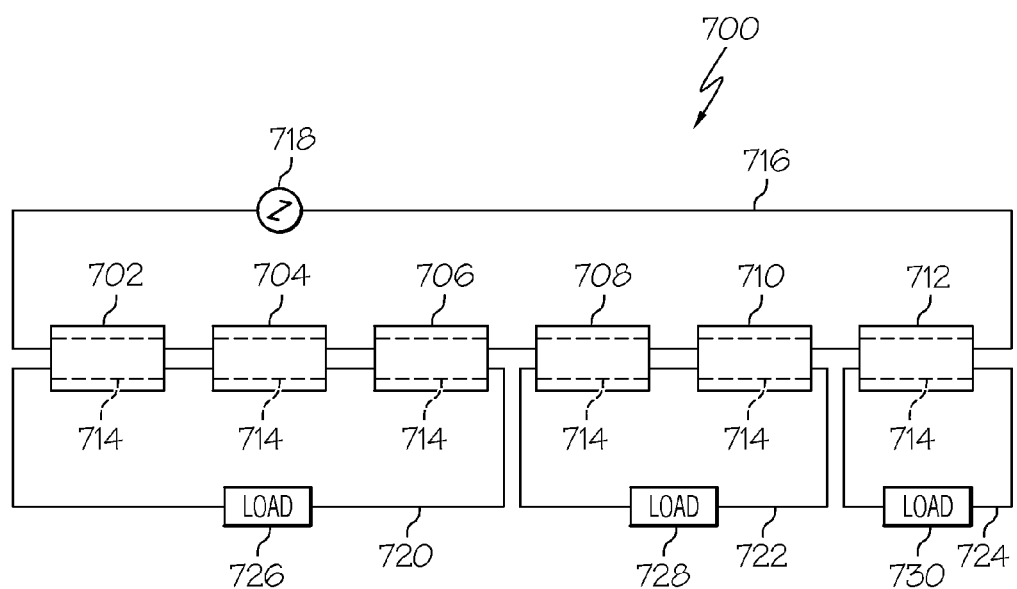
FIG. 7A is an illustration of an example of a linear transformer in accordance with a further embodiment of the present disclosure.

FIG. 7A is an illustration of an example of a linear transformer 700 in accordance with a further embodiment of the present disclosure. The linear transformer 700 may be similar to the linear transformer 300 in FIG. 3A except the linear transformer 700 includes a plurality of cores 702-712. Each of the cores 702-712 may have an opening 714 formed through the core. The opening 714 may be through substantially a center or central portion of the core 702-712. Each opening 714 may be an elongated slot or other configuration. A single primary conductor 716 or a plurality of primary conductors may pass through the opening 714 in each core 702-712. The primary conductor 716 may be connected to an electrical source 718.

The linear transformer 700 may also include a plurality of secondary conductors 720, 722 and 724 for coupling a selected number of the cores to a respective load 726, 728 and 730 for supplying a different magnitude of electrical output voltage and current to the respective loads 726, 728 and 730. For example, the secondary conductor 720 may pass through the openings 714 in cores 702, 704 and 706 and may connect to the load 726. The secondary conductor 722 may pass through the opening 714 in cores 708 and 710 and connect to the load 728. The secondary conductor 724 may pass through the opening 714 in the core 712 and connect to the load 730.

Each of the secondary conductors 720, 722 and 724 may be a single conductor or wire or a plurality of conductors or wires. If the secondary conductors 720, 722 and 724 each include a plurality of conductors, the number of conductors or wires in each secondary 720, 722 and 724 may be a different number of conductors or wires depending upon the desired electrical voltage and current to be supplied by the secondary.

Each of the primary conductor or conductors 716 and secondary conductor or conductors 720, 722 and 724 may have a substantially square or rectangular cross-section and may be disposed in the elongated slot adjacent one another in a single row similar to conductors 212 to that illustrated in FIG. 2A.

Figure 7B:
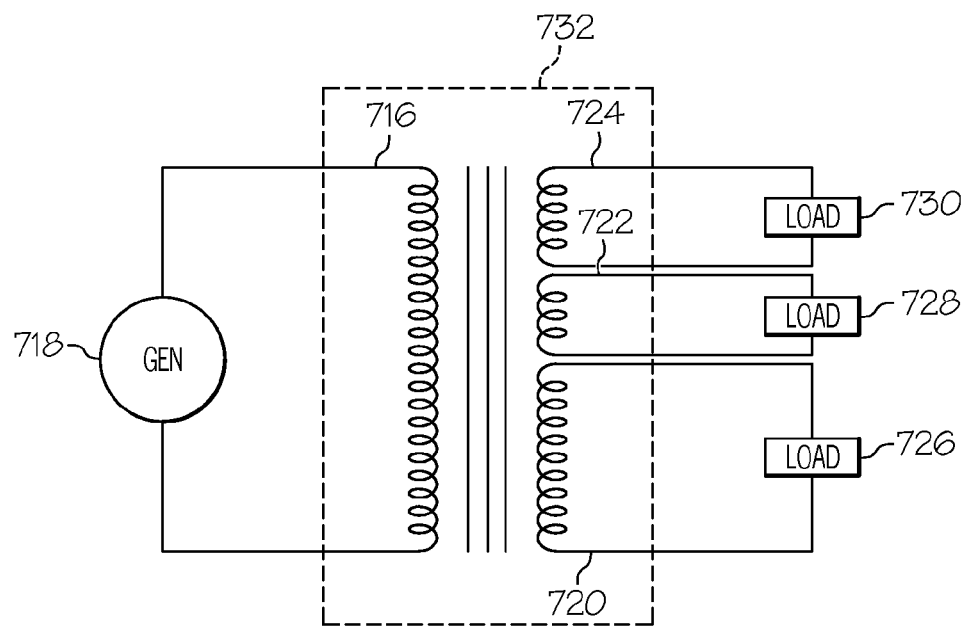
FIG. 7B is a block diagram of an electrical circuit including the linear transformer of FIG. 6 in accordance with an embodiment of the present disclosure.

FIG. 7B is a block diagram of an electrical circuit 732 including the linear transformer 700 of FIG. 7A in accordance with an embodiment of the present disclosure.

Figure 8:
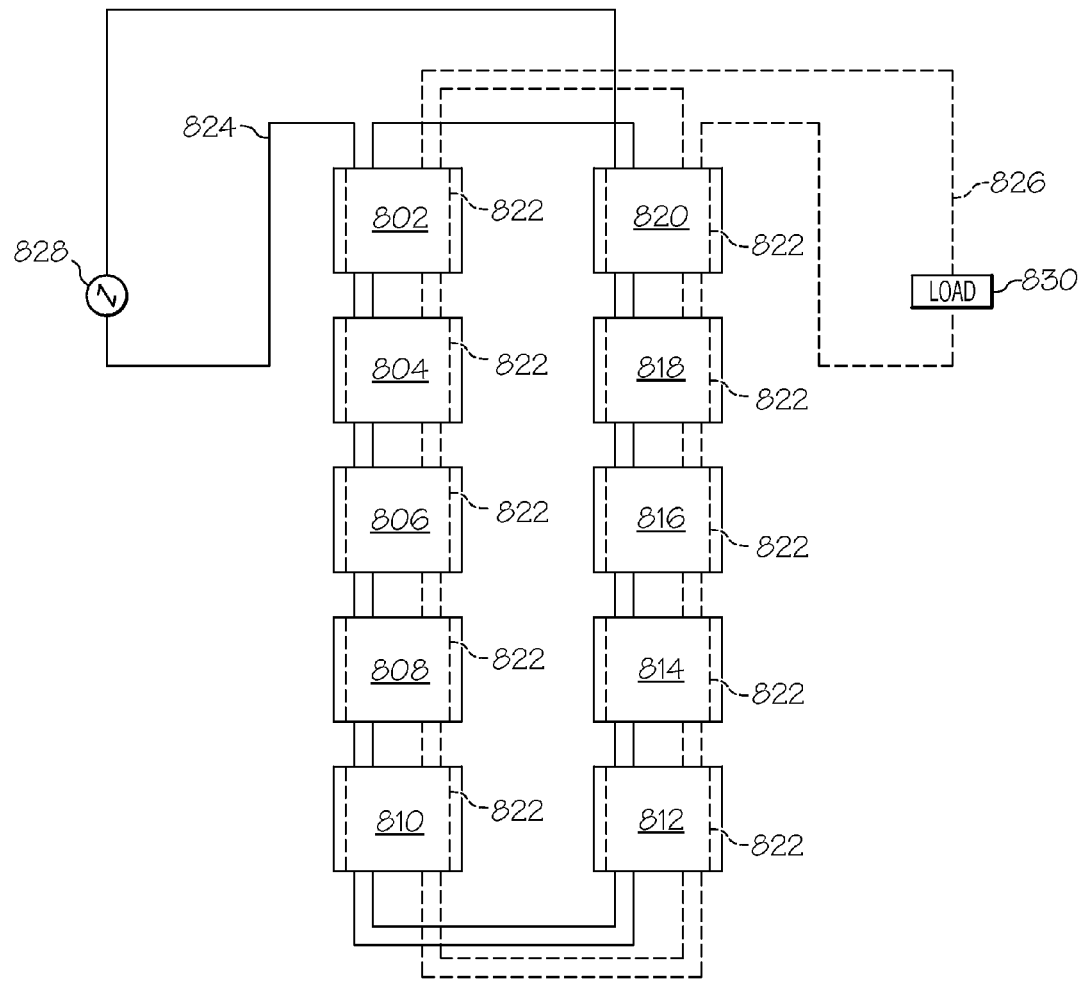
FIG. 8 is an illustration of an example of another linear transformer in accordance with an embodiment of the present disclosure.

FIG. 8 is an illustration of an example of another linear transformer 800 in accordance with an embodiment of the present disclosure. The transformer 800 also includes a plurality of cores 802-820. Each core 802-820 may have at least one opening 822 formed therein. The at least one opening 822 may be formed in a center or central portion of each core 802-820. Each opening 822 may be a substantially elongated slot.

A primary conductor 824 and a secondary conductor 826 may extend through each opening 822 in each core 802-820. The primary conductor 824 may be a single conductor or wire or a plurality of conductors or wires. The secondary conductor 826 may also be a single conductor or a plurality of conductors.

Primary conductor 824 or each of the primary conductors and the secondary conductor 826 or each of the secondary conductors may have a substantially square or rectangular cross-section and may be disposed in the opening 822 or elongated slot adjacent one another in a single row. An electrical power source 828 may be connected to the primary conductor 824 and a load 830 may be connected to the secondary conductor 826.

Figure 9:
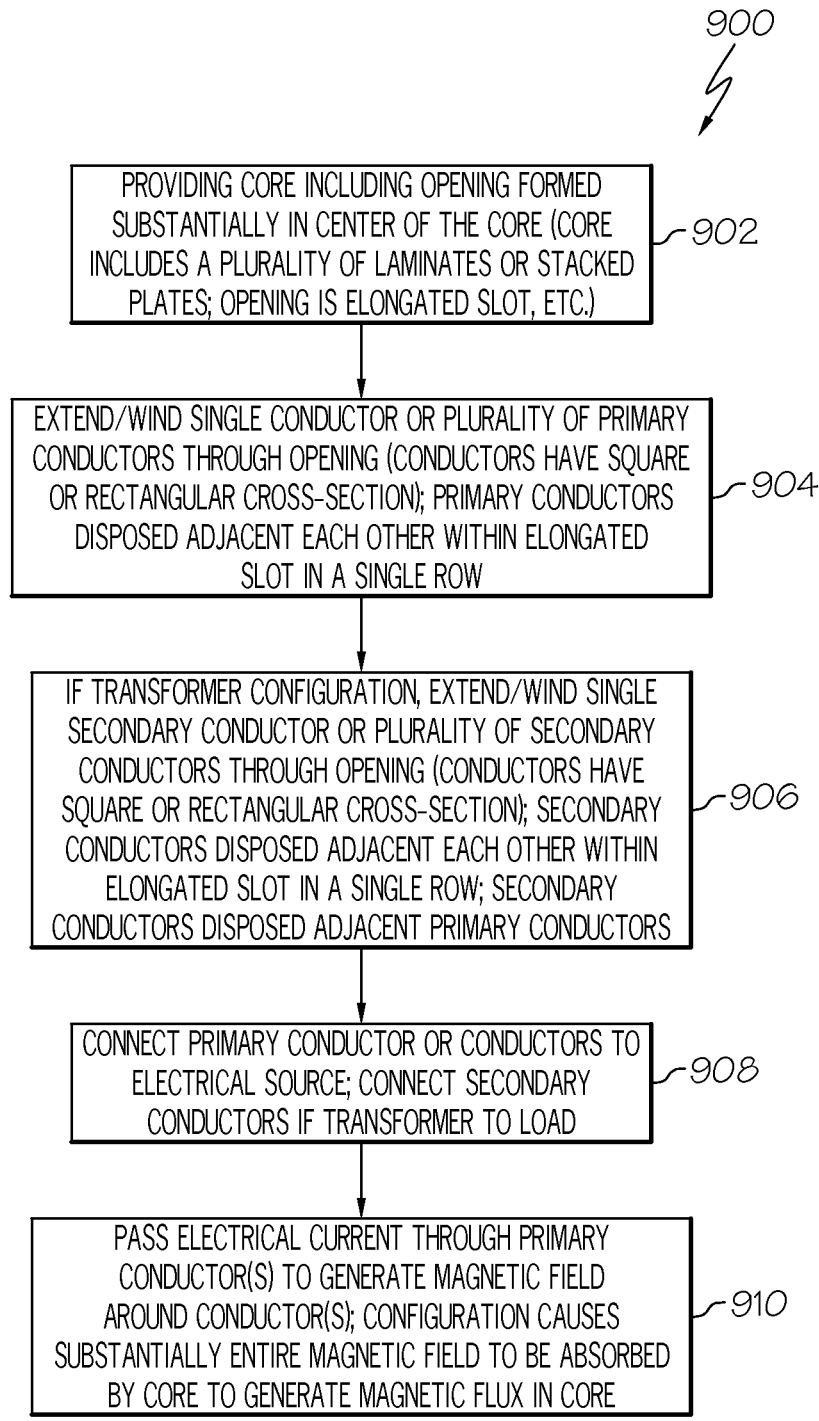
FIG. 9 is a flow chart of an example of a method of increasing a magnetic flux from an electromagnetic device in accordance with an embodiment of the present disclosure.

FIG. 9 is a flow chart of an example of a method 900 of increasing a magnetic flux from an electromagnetic device in accordance with an embodiment of the present disclosure. In block 902, at least one core may be provided including an opening formed in the core. The opening may be formed substantially in a center or central portion of the core. The core may include a plurality of laminate or stacked plates similar to that described herein. The opening may be an elongated slot or other shape depending upon the application and desired magnetic coupling between the core and electrical conductors extending through the opening in the core.

In block 904, a single primary conductor or a plurality of primary conductors may be extended through the opening. The conductors may have a substantially square or rectangular cross-section as previously described. The primary conductors may be disposed adjacent each other within the elongated slot in a single row.

In block 906, if the electromagnetic device is a transformer, a single secondary conductor or a plurality of secondary conductors may be extended through the opening. The secondary conductor or conductors may also have a substantially square or rectangular cross-section. The secondary conductors may be disposed adjacent each other within the elongated slot in a single row. The group of secondary conductors may be disposed adjacent the group of primary conductors in the same row with a predetermined spacing between the groups of conductors.

In block 908, the primary conductor or conductors may be connected to an electrical source and if the electromagnetic device is a transformer including secondary conductors, the secondary conductors may be connected to a load.

In block 910, an electrical current may be passed through the primary conductor or conductors to generate a magnetic field around the conductor or conductors. The configuration of the conductor or conductors extending through the opening in substantially the center or a central portion of the core causes substantially the entire magnetic field or at least about 96% of the magnetic field to be absorbed by the core to generate magnetic flux in the core. The core may also be sized so that the magnetic flux is also be substantially completely contained within the core.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the embodiments herein have other applications in other environments. This application is intended to cover any adaptations or variations of the present disclosure. The following claims are in no way intended to limit the scope of the disclosure to the specific embodiments described herein.

What is claimed is:

1. A linear electromagnetic device, comprising:
   a core in which a magnetic flux is generable;
   an opening through the core, wherein the opening through the core comprises an elongated slot, the elongated slot comprising opposite elongated side walls formed by the core that are longer than each end wall of the elongated slot;
   a plurality of primary conductors received in the opening and extending through the core, each primary conductor including a substantially square or rectangular cross-section and are each disposed in a single row in the elongated slot, wherein an electrical current flowing through the primary conductors generates a magnetic field about the primary conductors, substantially the entire magnetic field being absorbed by the core to generate the magnetic flux in the core; and
   a plurality of secondary conductors received in the opening and extending through the core, wherein the electromagnetic device defines a transformer, each secondary conductor including a substantially square or rectangular cross-section and are each disposed in the single row in the elongated slot adjacent the primary conductors, wherein each of the plurality of primary conductors and each of the plurality of secondary conductors include a predetermined height in a direction transverse to the elongated side walls and each primary conductor and each secondary conductor are less than about one half of the predetermined height from each elongated side wall formed by the core and wherein the plurality of secondary conductors are in a group separate from the plurality of primary conductors.

2. The linear electromagnetic device of claim 1, wherein a spacing between the primary conductors and the secondary conductors and each elongated side wall of the opening is no more than about one half of a dimension of the cross-section of the primary conductors and secondary conductors in any direction.

3. The linear electromagnetic device of claim 1, wherein a cross-section of each primary conductor and each secondary conductor of the plurality of primary and secondary conductors comprises a predetermined width in a direction corresponding to a length of the elongated slot and an end conductor on each end of the single row of conductors being less than about one half of the predetermined width from an end of the elongated slot, and the cross-section of each primary conductor and secondary conductor of the plurality of primary and secondary conductors comprising a predetermined height, each primary conductor and secondary conductor being less than about one half of the predetermined height from each elongated side wall of the elongated slot.

4. The linear electromagnetic device of claim 1, wherein the core comprises a plurality of plates stacked on one another.

5. The linear electromagnetic device of claim 1, wherein the core comprises one of a silicon-steel alloy core and a nickel-iron alloy core.

6. The linear electromagnetic device of claim 1, wherein the core comprises a nickel-iron alloy including about 20% iron and about 80% nickel.

7. The linear electromagnetic device of claim 1, further comprising at least one other core, the at least one other core comprising an opening through which the primary and secondary conductors extend through the at least one other core.

8. The linear electromagnetic device of claim 1, wherein the core comprises a size corresponding to a predetermined magnetic flux penetration.

9. The linear electromagnetic device of claim 1, wherein the core comprises dimensions so that at least about 96% of the magnetic field is absorbed by the core to generate the magnetic flux in the core.

10. The linear electromagnetic device of claim 1, wherein the opposite elongated side walls are connected at each end by a respective one of the end walls, each primary conductor and secondary conductor including a predetermined width in a direction corresponding to the elongated side walls, an end primary conductor and an end secondary conductor being less than about one half of the predetermined width from each respective one of the end walls.

11. The linear electromagnetic device of claim 1, further comprising a spacing between each end of the elongated slot and a respective end conductor at each end of the single row of primary and secondary conductors, wherein each of the primary and secondary conductors comprise a predetermined width in a direction corresponding to an elongated dimension or length of the elongated slot, the spacing between each end of the elongated slot and the respective end conductor is less than about half of the predetermined width of each of the primary conductors.

12. The linear electromagnetic device of claim 1, wherein the core comprises a plurality of cores, the opening extending through each core and the plurality of secondary conductors each respectively extending through the opening in different ones of the plurality of cores to couple a selected number of the cores to different respective loads for supplying a different magnitude of electrical output voltage and current to the respective loads.

13. A linear electromagnetic device, comprising:
   a core in which a magnetic flux is generable;
   an opening through the core, wherein the opening through the core comprises an elongated slot, the elongated slot comprising opposite elongated side walls formed by the core that are longer than each end wall of the elongated slot;

a plurality of primary conductors received in the opening and extending through the core, each primary conductor including a substantially square or rectangular cross-section, wherein an electrical current flowing through the primary conductors generates a magnetic field about the primary conductors, substantially the entire magnetic field being absorbed by the core to generate the magnetic flux in the core; and a plurality of secondary conductors received in the opening and extending through the core, each secondary conductor including a substantially square or rectangular cross-section to receive an electromotive force transmitted by the core, wherein the secondary conductors are grouped together in a single row and are disposed adjacent the primary conductor which are grouped together in the single row and each conductor includes a predetermined height in a direction transverse to the elongated side walls and each conductor is less than about one half of the predetermined height from each elongated side wall formed by the core.

14. The linear electromagnetic device of claim 13, wherein a cross-section of each primary conductor of the plurality of conductors and each secondary conductor of the plurality of conductors comprises a predetermined width in a direction corresponding to a length of the elongated slot and an end primary conductor adjacent one end of the elongated slot is less than about one half of the predetermined width from the one end of the elongated slot and an end secondary conductor adjacent an opposite end of the elongated slot being less than about one half of the predetermined width from the opposite end of the elongated slot.

15. The linear electromagnetic device of claim 13, further comprising at least one other core, the at least one other core comprising an opening through which the primary conductor and the secondary conductor each extend through the at least one other core.

16. The linear electromagnetic device of claim 15, wherein the core and the at least one other core each comprises a plurality of plates stacked on one another.

17. The linear electromagnetic device of claim 13, wherein the core comprises a size corresponding to a predetermined magnetic flux penetration.

18. A method of increasing a magnetic flux from an electromagnetic device, comprising:

providing a core in which a magnetic flux is generable;

extending a plurality of primary conductors through an opening in the core, wherein the opening through the core comprises an elongated slot, the elongated slot comprising opposite elongated side walls formed by the core that are longer than each end wall of the elongated slot, each primary conductor including a substantially square or rectangular cross-section and each disposed adjacent one another in a single row in the opening;

passing an electrical current through the primary conductor to generate a magnetic field about the primary conductor, wherein substantially the entire magnetic field is absorbed by the core to generate a magnetic flux in the core; and extending a plurality of secondary conductors through the elongated slot in the core, the secondary conductors being disposed in the single row in the opening adjacent the plurality of primary conductors and each secondary conductor including a substantially square or rectangular cross-section, wherein each of the plurality of secondary conductors and each of the plurality of primary conductors include a predetermined height in a direction transverse to the elongated side walls and each primary conductor and each secondary conductor are less than about one half of the predetermined height from each elongated side wall formed by the core and wherein the plurality of secondary conductors are in a group separate from the plurality of primary conductors.

19. The method of claim 18, wherein providing the core comprises providing a core including the elongated slot for the opening, the primary conductors and the secondary conductors being disposed in the single row in the elongated slot.

20. The method of claim 18, further comprising spacing each of the primary and secondary conductors less than about one half a dimension of the cross-section of the conductors from each elongated side wall of the elongated slot.

21. The method of claim 18, wherein providing the core comprises providing a core comprising dimensions for absorbing substantially the entire magnetic field.

* * * * *